(12) United States Patent  
Moller

(10) Patent No.: US 6,429,510 B1
(45) Date of Patent: Aug. 6, 2002

(54) LIQUID DAMPING OF HIGH FREQUENCY BOND WIRE VIBRATION

(75) Inventor: Thomas W. Moller, Gilroy, CA (US)

(73) Assignee: Ericsson Inc., Plano, TX (US)

( * ) Notice: Subject to any disclaimer, the term of this patent is extended or adjusted under 35 U.S.C. 154(b) by 0 days.

(21) Appl. No.: 09/871,445

(22) Filed: May 30, 2001

(51) Int. Cl.[7] .............................................. H01L 23/48
(52) U.S. Cl. ...................... 257/690; 257/784; 438/127
(58) Field of Search ................................ 257/690, 738, 257/784, 666, 786; 438/126, 127

(56) References Cited

U.S. PATENT DOCUMENTS 5,808,354 A    9/1998  Lee et al. .................... 257/666
5,930,604 A    7/1999  Leonard et al. .............. 438/127
5,945,643 A *  8/1999  Casser ......................... 181/290
6,057,601 A    5/2000  Lau et al. .................... 257/738

* cited by examiner

Primary Examiner—David Nelms
Assistant Examiner—Andy Huynh
(74) Attorney, Agent, or Firm—Lyon & Lyon LLP

(57) ABSTRACT

A plurality of conductors and an electrical component are disposed on a substrate, wherein the electrical component has a plurality of leads that are connected to the conductors on the substrate by a plurality of bond wires. A damping material is then situated in contact with the plurality of bond wires, the damping material chosen so that the plurality of bond wires can move in relation to the damping material. The damping material may be a viscous liquid kept in contact with the bond wires by a containing lid attached to the substrate. Alternatively, the damping material may be a colloidal mixture involving a liquid or an elastomer.

20 Claims, 2 Drawing Sheets

LIQUID DAMPING OF HIGH FREQUENCY BOND WIRE VIBRATION

BACKGROUND OF THE INVENTION

1. Field of the Invention

The present invention pertains to the field of electrical circuit assemblies, and more particularly to electrical circuit assemblies employing wires to electrically connect various circuit component terminals and/or conductors.

2. Background

Integrated circuits have many uses in industries ranging from communications to consumer electronics. A typical integrated circuit is formed by fabricating one or more semiconductor devices on a silicon wafer, often referred to as a chip. This chip is attached to a thermally conductive substrate, which may be suitable for mounting to a printed circuit board (PCB) or other carrier, as part of a greater electrical circuit assembly. A protective cover may be secured over the chip and substrate, wherein electrical contact leads extend through, or from under the lid, thereby forming an integrated circuit package. The package leads connect common terminals of the chip to other circuit elements located on the PCB.

Electrical connections between the leads of an integrated circuit package and contact terminals on the chip, as well as in-between contact terminals on the same or between chips, are often made with wires that "jump" between the contact points, e.g., over an insulating structure or pathway. Such conducting wires are normally very small, typically having a diameter of a quarter of a millimeter or less. The wires are bonded to the contact terminals or leads using various techniques well known in the art, including thermosonic and ultrasonic bonding and soldering. Such wires are referred to herein as "bond wires."

Electrical assemblies used in, for example, aerospace, automotive, and high frequency wireless communication applications can be subjected to intense vibrations. Due to their small diameters, bond wires are particularly susceptible to these vibrations at high frequencies. Over a sufficient number of cycles, the bond wires, including the bond pad where the bond wire connects to the lead or contact terminal, can fail due to fatigue fracture, which occurs when a material is deformed. The number of cycles until a material will fracture from fatigue increases as the deformation decreases.

One approach for preventing low-cycle fatigue failure due to thermal stresses involves encapsulating the wires with an epoxy, as described in U.S. Pat. Nos. 5,930,604 and 5,808,354, completing preventing movement of the wires and also preventing a short circuit between adjacent bond wires. The encapsulating material is poured over the assembly, including the bond wires, and solidified in order to immobilize the wires. This technique has several disadvantages. For example, the wires and respective bond pads are subject to thermal stresses due to differences in the thermal expansion coefficients of the encapsulating material and the materials that form the chip. Also, methods of manufacturing such chips can create voids, or gas pockets within the material, which create stress concentrations and lead to premature failure.

SUMMARY OF THE INVENTION

The present invention is directed to decreasing bond wire fractures in electrical assemblies and integrated circuit packages due to high frequency vibrations by decreasing the mechanical deformation of the bond wires as they respond to the vibrations, while still allowing for some movement of the wires to relieve thermal stresses and avoid other complications caused by the prior art technique of immobilizing the wires.

In one embodiment, terminals of an electrical component, such as, e.g., gate and drain terminals of a LDMOS power transistor, are connected by respective pluralities of bond wires to input and output leads extending from a substrate upon which the component is mounted. A damping material encompasses the bond wires, the damping material chosen to restrain but still allow movement of the bond wires in relation to the damping material. By way of non-limiting examples, the damping material may be various colloidal mixtures, perhaps but not necessarily liquid, or a viscoelastic material.

Other and further aspects and advantages of the invention will become apparent in view of the following detailed description of the preferred embodiments.

BRIEF DESCRIPTION OF THE DRAWING

Preferred embodiments are illustrated by way of example, and not by way of limitation, in the figures of the accompanying drawings, in which like reference numerals refer to like components, and in which.

DETAILED DESCRIPTION OF THE PREFERRED EMBODIMENTS

Figure 1:
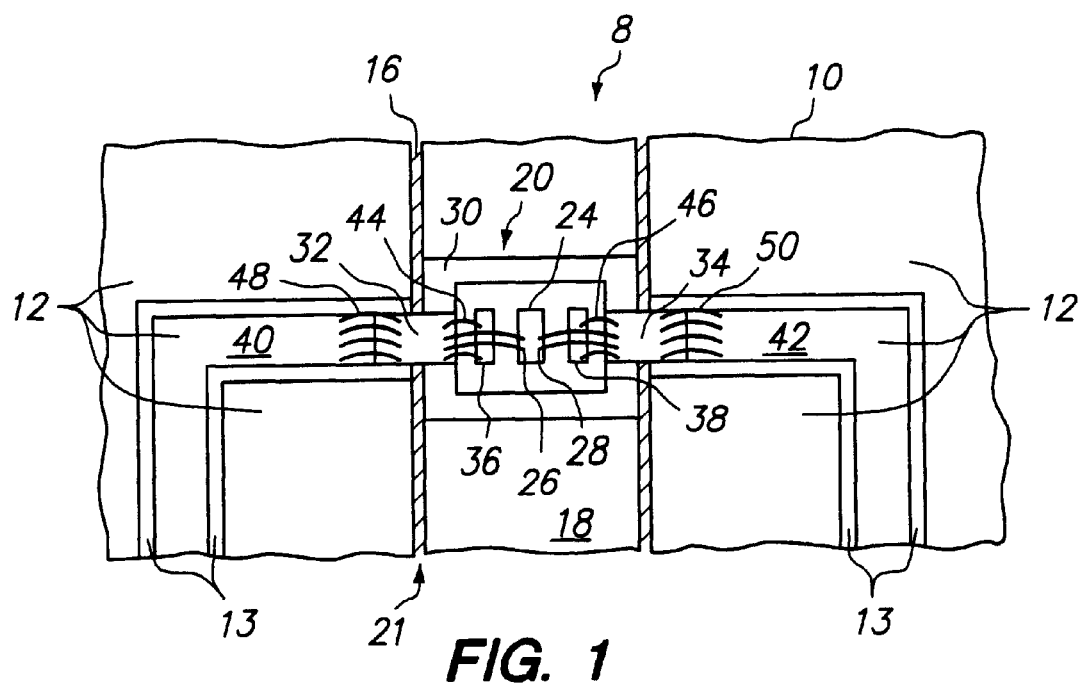
FIG. 1 is a top planar view of an exemplary electrical circuit assembly, excluding containment lid and damping material, constructed in accordance with one preferred embodiment of the invention.
Figure 2:
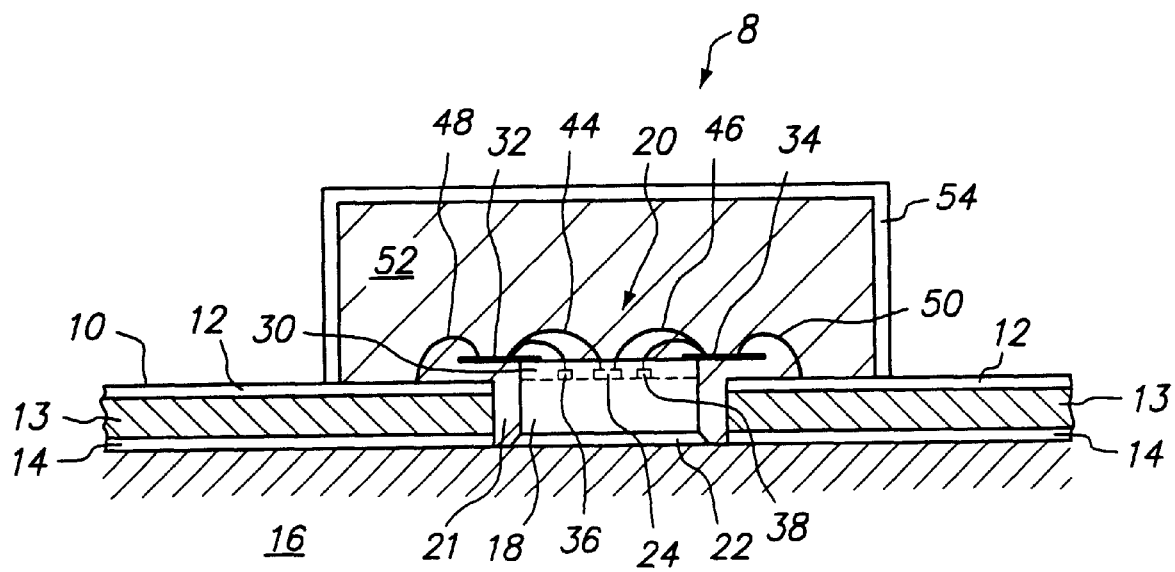
FIG. 2 is a partially cut-away side view of the electrical circuit assembly of FIG. 1, including the containment lid and damping material.

In accordance with one embodiment of the invention, FIGS. 1 and 2 depict an electrical assembly 8, including a multilayer PCB 10, power transistor package 20, substantially liquid damping material 52, and containment lid 54. More particularly, the PCB 10 includes a conductive top layer 12, dielectric insulating layer 13, and conductive bottom layer 14, respectively. In alternate embodiments, the PCB 10 may include several further alternating conductive and dielectric layers, and the invention is not limited to a particular PCB embodiment. The bottom layer 14 of PCB 10 is attached to a heat sink 16. A mounting substrate 18 of the power transistor package 20 is attached to the heat sink 16 in a cutaway window area 21 of the PCB 10 by a conductive adhesive or solder layer 22. As will be appreciated by those skilled in the art, other means for attaching the substrate 18, such as screws or tensioned spring mechanisms, are well known in the art and may be equally employed without varying from the inventive concepts disclosed herein.

The power transistor package 20 includes a transistor chip 24 attached to a top surface of the substrate 18 and having one or more transistors (not shown) formed thereon. In the illustrated embodiment, laterally diffused metal oxide semiconductor (LDMOS) transistors are employed, although other transistor types (e.g., bi-polar junction devices) may be used in alternate embodiments without departing from the inventive concepts taught herein. The transistors on chip 24 have a plurality of input (gate) terminals 26 and output (drain) terminals 28 located on a top surface of the chip 24. A dielectric window substrate 30 is attached to the top surface of the substrate 18, enclosing the transistor chip 24. The window substrate 30 serves to electrically isolate respective input and output leads 32 and 34, respectively, from the substrate 18.

The power transistor package 20 further includes input and output matching elements (e.g., capacitors or inductors) 36 and 38 attached to the top surface of the substrate 18 on respective sides of the transistor chip 24. A first set of bond wires 44 electrically couple the input lead 32 to the respective transistor gate terminals 28 and input matching element 36. A second set of bond wires 46 electrically couple the output lead 34 to the respective transistor drain terminals 28 and output matching element 38. As used herein, a "set" of bond wires means one or more bond wires.

Potions of the top conductive layer 12 of the PCB 10 are cutaway on respective sides of the window area 21 to form respective metallic strip conductors 40 and 42 separated from the rest of layer 12 by the exposed dielectric layer 13. The metallic strip conductors 40 and 42 provide a conductive pathway to connect the transistor package input and output leads 32 and 34 to passive and active components (not shown) of the electrical assembly 8 located elsewhere on (or in) the PCB 10. Towards this end, further sets of bond wires 48 and 50 are used to electrically couple the input and output leads 32 and 34 to the strip conductors 40 and 42, respectively. The bond wires in bond wire sets 44, 46, 48 and 50 are very thin, electrically conductive wires, having a diameter of a quarter of a millimeter or less, and are bonded to the various contact points using techniques known in the art, including thermosonic and ultrasonic bonding and soldering.

As seen in FIG. 2, the damping material 52 is contained against the PCB 10 by the containment lid 54, so as to surround the individual bond wires of the bond wires sets 44, 46, 48 and 50. The damping material 52 is selected to minimize the vibrations of the individual bond wires, which will vibrate with the high frequency signals transmitted through the power transistor package 20. In alternate embodiments, the damping material 52 may not require a containment system. For example, if the damping material 44 does not flow (e.g., an elastomer), the containment lid 54 would be unnecessary. Whether or not a liquid, the damping material 52 is preferably dielectric, i.e., substantially electrically non-conductive, to prevent short circuits.

Figure 3:
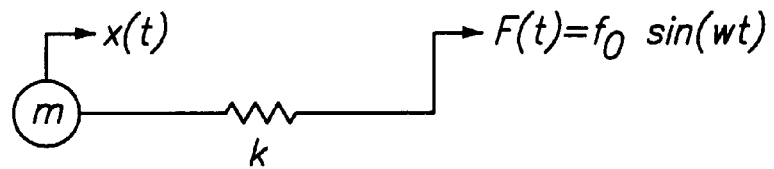
FIG. 3 is a diagram of a mathematical model of undamped bond wires used for making electrical connections in high frequency electrical circuits.

A single bond wire attached to a vibrating surface (e.g., the transistor chip terminals 26 and 28) can be modeled as a mass on the end of a spring that is driven by a force at a given frequency. FIG. 3 shows a mass, m, connected at one end of a spring having a stiffniess, k, which is driven at the other end by an oscillating force, F(t). It can be appreciated that this is a simplified model, and FIG. 3 illustrates a basic concept that could also be described with more complicated models. It can be appreciated that, in response to the oscillating driving force, F(t), the mass will have an oscillating displacement, x(t).

Figure 5:
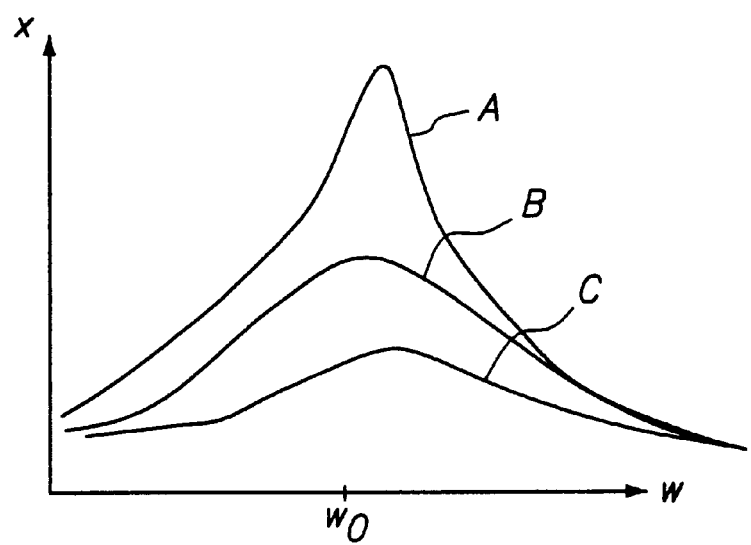
FIG. 5 is a graph of the frequency response curves for undamped, lightly damped, and heavily damped bond wires, respectively.

The amplitude of the oscillating displacement, x(t), will depend on the frequency and amplitude of the driving force, F(t). As known in the art, the mass-spring system of FIG. 3 has a natural frequency, $\omega_o$, which depends on the mass, m, and the stiffness of the spring, k. If driven at its natural frequency, the mass will oscillate at maximum amplitude, illustrated by curve A on FIG. 5. Therefore, bond wires have a natural frequency given their stiffness and mass, and if they are driven by the surface to which they are connected at that frequency they may vibrate significantly. These vibrations cause deformations in the bond wires and their bond pads, which may result in fatigue fracture over many cycles.

Figure 4:
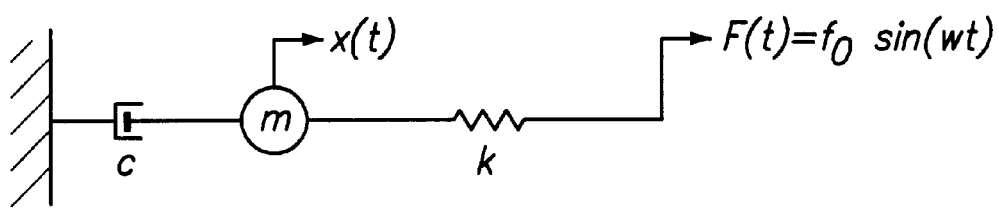
FIG. 4 is a diagram of a mathematical model of the damped bond wires used to make connections in the electrical circuit assembly of FIG. 1.

In the model, vibrations can be reduced by adding a damper, as modeled by FIG. 4. A damper has the property of producing a force directly proportional to and opposite the rate of displacement, and its constitutive relation is given by: $F_c = c\, x'(t)$, where $x'(t)$ is the time derivative of the displacement, x(t). It can be shown that adding this damper to the mass-spring model reduces the vibrations of the mass, as shown by curves B and C in FIG. 5. Curve C represents the frequency response of a system having a larger damping coefficient, c, than curve B, and the vibrations in the system of curve C are correspondingly reduced.

The particular damping material determines the damping constant, c, in FIG. 4. For example, if the damping effect is negligible (e.g., no damping material is used so that air surrounds the bond wires), the damping coefficient, c, approaches zero, and the model of FIG. 4 simplifies to the undamped model of FIG. 3. Various materials suitable as a damping material exist. It can be appreciated that the desired damping of the bond wires depends on their mass (modeled as m) and stiffness (modeled as k) and the typical vibrations of the assembly (modeled as F(t)). Depending on these variables, various damping materials with various damping properties may be appropriate. For example, a liquid might be used to damp the vibrations of the bond wires. A liquid with a higher viscosity will have greater damping ability, as viscosity is a measurement of the amount of shear stress the liquid can deliver to the bond wires for a given shear rate, or movement, in relation to the wires.

Other damping materials may also be appropriate for damping the bond wires. These include foams, emulsions, gels, and other viscoelastic materials. A foam is a dispersion of gas bubbles in a liquid, in which at least one dimension falls within the colloidal size range. Types of foams include solid foams and biliquid foams. A solid foam is a colloidal dispersion of a gas in a solid, such as polystyrene foam. A biliquid foam is a concentrated emulsion of one liquid dispersed in another liquid. An emulsion is a dispersion of droplets of one liquid in another, immiscible liquid, in which the droplets are of colloidal or near-colloidal sizes. An aerated emulsion is foam in which the liquid component consists of two phases in the form of an emulsion. For example, whipped cream is an aerated emulsion of air bubbles dispersed in cream, which itself is an emulsion. A gel is a suspension or polymer solution that behaves as an elastic solid or semi-solid rather than a liquid.

In one preferred embodiment, a selected damping material is of a nature such that movement of the bond wire in response to vibrations caused by electrical signal propagation through the bond wire is damped but not completely prevented, such that the damping material can be said to "movably encapsulate" the bond wires. Notably, Because a damping material will most likely produce a restorative force as well as a damping force; therefore, the damper in FIG. 4 could be more accurately modeled by a network of springs and dampers. The purpose of the model, however, is to show the effect of adding a damping material to the system, and it is within the ability of persons skilled in the art to empirically determine the required system parameters.

Another factor in selecting an appropriate damping material is the materials ability to rapidly dissipate heat from the transistor chip 24. For example, co-pending patent application S/N (not-yet-assigned, Lyon & Lyon attorney docket 258/096, entitled "Thermal Management of Multilayer Circuit Assembly," and filed on the same date herewith), which is fully incorporated by reference, describes a system for cooling integrated circuits by dissipating heat generated by electrical components on the circuit board to a surrounding liquid, and further dissipating the heat from the liquid to the environment. If the damping material 52 of the assembly 8 disclosed herein were the same as the heat dissipating liquid taught in the above-incorporated application, it is apparent that the resulting system would provide for both damping of bond wire vibrations as well as cooling of the circuit by the same means.

While preferred embodiments and applications have been shown and described, as can be appreciated by those of ordinary skill in the art, the invention can be embodied in other specific forms without departing from the inventive concepts contained herein. The presently disclosed embodiments, therefore, should be considered as illustrative, not restrictive.

For example, use of the lid 54 is just one (simple) example of a containment system for the damping material. Depending on the particular assembly structure and the type of selected damping material, many other types of containment systems are possible and contemplated within the scope of the invention. What matters is that the damping material be in contact with the bond wires so as to absorb some of the vibration energy caused by the high frequency signal propagation through the wires. Whether and what type of containment system may be needed is a design choice that may differ from embodiment to embodiment.

Accordingly, the invention should not be limited except by the scope of the appended claims and their equivalents.

What is claimed is:

1. An electrical circuit assembly, comprising:
   a substrate having disposed thereon a conductor;
   an electrical component having a terminal;
   a bond wire electrically connecting the conductor to the terminal; and
   a damping material situated in contact with the bond wire, the damping material of a nature such that movement of the bond wire in response to vibrations caused by electrical signal propagation through the bond wire is damped, but not prevented.
2. The electrical circuit assembly of claim 1, wherein the damping material is a liquid.
3. The electrical circuit assembly of claim 1, wherein the damping material is a dielectric.
4. The electrical circuit assembly of claim 1, wherein the damping material is thermally conductive.
5. The electrical circuit assembly of claim 1, wherein the bond wire is movably encapsulated by the damping material.
6. The electrical circuit assembly of claim 2, further comprising a containment system to keep the damping material in contact with the bond wire.
7. The electrical circuit assembly of claim 1, wherein the damping material is a colloidal mixture of a solid in a liquid.
8. The electrical circuit assembly of claim 1, wherein the damping material is a colloidal mixture of a gas in a liquid.
9. The electrical circuit assembly of claim 1, wherein the damping material is a viscoelastic material.
10. The electrical circuit assembly of claim 1, wherein the electrical component is a RF power transistor chip.
11. An electrical circuit assembly, comprising:
    a plurality of bond wires forming respective electrical connections; and
    a damping material situated in contact with the bond wires, the damping material of a nature such that movement of the bond wires in response to vibrations caused by electrical signal propagation through the bond wires is damped but not completely prevented.
12. The electrical circuit assembly of claim 11, wherein the damping material is a liquid.
13. The electrical circuit assembly of claim 11, wherein the damping material is a dielectric.
14. The electrical circuit assembly of claim 11, wherein the damping material is thermally conductive.
15. The electrical circuit assembly of claim 11, wherein the bond wire is movably encapsulated by the damping material.
16. The electrical circuit assembly of claim 12, further comprising a containment system to keep the damping material in contact with the bond wire.
17. The electrical circuit assembly of claim 11, wherein the damping material is a colloidal mixture of a solid in a liquid.
18. The electrical circuit assembly of claim 11, wherein the damping material is a colloidal mixture of a gas in a liquid.
19. The electrical circuit assembly of claim 11, wherein the damping material is a viscoelastic material.
20. The electrical circuit assembly of claim 11, wherein the damping material is a thermally conductive dielectric.

* * * * *